(12) United States Patent
Kim

(10) Patent No.: US 7,342,408 B2
(45) Date of Patent: Mar. 11, 2008

(54) SEMICONDUCTOR TEST DEVICE USING LEAKAGE CURRENT AND COMPENSATION SYSTEM OF LEAKAGE CURRENT

(75) Inventor: Kwang-Il Kim, Suwon-si (KR)

(73) Assignee: Samsung Electronics Co., Ltd, Gyeonggi-Do (KR)

( * ) Notice: Subject to any disclaimer, the term of this patent is extended or adjusted under 35 U.S.C. 154(b) by 0 days.

(21) Appl. No.: 11/510,621

(22) Filed: Aug. 28, 2006

(65) Prior Publication Data
US 2007/0018679 A1 Jan. 25, 2007

Related U.S. Application Data

(62) Division of application No. 10/898,219, filed on Jul. 26, 2004, now Pat. No. 7,116,125.

(30) Foreign Application Priority Data

| Aug. 4, 2003 | (KR) | ............................ 2003-53860 |
| Aug. 4, 2003 | (KR) | ............................ 2003-53861 |
| May 4, 2004 | (KR) | ............................ 2004-31461 |

(51) Int. Cl.
*G01R 31/26* (2006.01)
(52) U.S. Cl. .................................. 324/765
(58) Field of Classification Search ........ 324/760–769, 324/158.1; 438/14–18; 714/724, 733
See application file for complete search history.

(56) References Cited

U.S. PATENT DOCUMENTS 5,768,290 A 6/1998 Akamatsu 6,343,039 B2* 1/2002 Agawa et al. ............. 365/203
6,452,841 B1 9/2002 Ferrant
6,456,105 B1 9/2002 Tao (Continued)

FOREIGN PATENT DOCUMENTS

JP 03-241595 10/1991

(Continued)

OTHER PUBLICATIONS

KIPO Office Action dated Nov. 29, 2005, with English Translation.

*Primary Examiner*—Vinh P. Nguyen
(74) *Attorney, Agent, or Firm*—Harness, Dickey & Pierce, P.L.C.

(57) ABSTRACT

The present invention relates to a semiconductor test device which may use a leakage current and/or a compensation system of leakage current. The semiconductor test device, according to exemplary embodiments of the present invention, may include MOS transistors which may be fabricated in processes similar to those of the semiconductor device. The semiconductor test device may sense the leakage currents which may flow in the MOS transistors, may test whether the semiconductor device may be fabricated normally or abnormally, and may generate at least a normal or abnormal signal as a result. The leakage current compensation device may compensate for the leakage current which may flow in the semiconductor device in response to the normal or abnormal signal of the semiconductor test device. According to exemplary embodiments of the present invention, abnormally-fabricated MOS transistors may be tested and malfunctions of the semiconductor device may be reduced by the leakage current compensation device.

13 Claims, 8 Drawing Sheets

U.S. PATENT DOCUMENTS

| | | |
|---|---|---|
| 6,681,193 B2 | 1/2004 | Dallavalle |
| 6,756,804 B2 | 6/2004 | Ishibashi |
| 2006/0097774 A1* | 5/2006 | Hasegawa ............... 327/538 |

FOREIGN PATENT DOCUMENTS

| | | |
|---|---|---|
| JP | 07-176584 | 7/1995 |
| JP | 10-022816 | 1/1998 |
| JP | 2000-200837 | 7/2000 |
| JP | 2001-060608 | 3/2001 |
| JP | 2001-185594 | 7/2001 |
| KR | 2001-0003345 | 1/2001 |
| KR | 1020030048695 | 6/2003 |

* cited by examiner

SEMICONDUCTOR TEST DEVICE USING LEAKAGE CURRENT AND COMPENSATION SYSTEM OF LEAKAGE CURRENT

CROSS-REFERENCE TO RELATED APPLICATIONS

This is a divisional of application No. 10/898,219 filed Jul. 26, 2004, now U.S. Pat. No. 7,116,125, which claims priority under 35 U.S.C. §119 of Korean Patent Application 2003-53860 filed on Aug. 4, 2003, Korean Patent Application 2003-53861 filed on Aug. 4, 2003, and Korean Patent Application 2004-31461 filed on May 4, 2004 the entire contents of which are hereby incorporated by reference.

BACKGROUND OF THE INVENTION

The present invention relates to semiconductor test devices which may use leakage current and compensation systems of leakage current.

Forming an MOS transistor, which may include a micro channel length, on a wafer may be difficult, more specifically, controlling the channel length of MOS transistor may be difficult. Techniques for controlling the micro channel length (e.g., a light source of shorter wavelength, a phase shift mask (PSM), a phase edge shift mask (PEMS) and an optical correct (OPC), etc.) may result in MOS transistors which may have a channel length greater than a critical channel length and may result in the malfunctioning of a semiconductor chip.

Each of the transistors and/or simple circuits (e.g., an inverter delay and/or a ring oscillator) may be formed on a wafer simultaneously, and may test MOS transistors. Parameters, which may indicate characteristics of transistors, may be extracted from the transistors and/or simple circuits, however, determining the parameters may become more difficult and may take a longer time because the semiconductor fabrication process, which may change the characteristic of MOS transistor, may become more complex. A leakage current may vary with the channel length in an off-mode of the MOS transistor, such that the leakage current may cause malfunctions of semiconductor chips which may be integrated with MOS transistors.

A thickness of oxide layer or layers in the MOS transistor may become smaller and the control of the MOS transistor may become more difficult by simplifying the semiconductor fabrication method. The leakage current may be increased by tunneling through the micro oxide layer and may cause the malfunctioning of the semiconductor circuits.

MOS capacitors, which may have a larger gate area, may be used at both terminals of a power supply source, and the gate leakage current may cause an electrical leakage. The leakage current may reduce a capacitance of the MOS capacitor and the circuit, which may include the capacitor, may operate abnormally.

SUMMARY OF THE INVENTION

Exemplary embodiments of the present invention may be directed to a semiconductor test device for testing an MOS transistor, which may be fabricated abnormally, and may cause at least one malfunction which may be due to a channel leakage current, in an off-mode.

Exemplary embodiments of the present invention may provide a semiconductor test device which may test a MOS transistor, which may be fabricated abnormally and may cause at least one malfunction due to a gate leakage current.

Exemplary embodiments of the present invention may provide a MOS transistor current compensation device which may compensate for a leakage current of a semiconductor device, which may be fabricated abnormally and may suffer from a leakage current.

A semiconductor test device according to an exemplary embodiment of the present invention may test a semiconductor device which may include at least one MOS transistor. The semiconductor test device may include a first leakage current source which may generate a first leakage current variably according to whether the MOS transistors may be fabricated normally, a second leakage current source which may generate a second leakage current variably according to whether the MOS transistors may be fabricated normally, and a comparator which may compare the first leakage current with the second leakage current and may determine whether the semiconductor device may be fabricated normally.

The first leakage current may be smaller than the second leakage current, and the MOS transistors may be fabricated normally; the first leakage current may be larger than the second leakage current, and the MOS transistors may be fabricated abnormally.

In exemplary embodiments of the present invention, the first and second leakage current sources may be MOS transistors.

In exemplary embodiments of the present invention, a semiconductor test device, which may use a leakage current, may include a first MOS transistor, a second MOS transistor and a comparator. The first MOS transistor may flow a first leakage current (referred to as I1) through a channel, which may have a critical channel length (referred to as L1) and/or a first leakage current (referred to as I1') through a channel which may have a channel length (referred to as L1') shorter than the L1 by $\Delta$L1, in an off-mode. The second MOS transistor may flow a second leakage current (referred to as I2) through a channel, which may have a critical channel length (referred to as L2) longer than the L1 and/or a second leakage current (referred to as I2') through a channel which may have a channel length (referred to as L2') shorter than the L2 by $\Delta$L2, in an off-mode. The comparator may compare the first leakage current with the second leakage current, and may determine whether the semiconductor device may be fabricated normally. The first MOS transistor may have a channel width W1 which may meet the conditions of I1<I2 and I1'>I2'. The second MOS transistor may have a channel width W2 which may meet conditions of I2>I1 and I2'<I1'.

In another exemplary embodiment of the present invention, the semiconductor test device which may use leakage current, may include a first MOS capacitor, a second MOS capacitor and a comparator. The first MOS capacitor may flow a first leakage current (referred to as J1) through an oxide layer which may have a critical thickness (referred to as T1) and/or a first leakage current (referred to as J1') through an oxide layer which may have a thickness (referred to as T1') smaller than the T1 by $\Delta$T1. The second MOS capacitor may flow a second leakage current (referred to as J2) through an oxide layer which may have a critical thickness (referred to as T2) larger than T1 and/or a second leakage current (referred to as J2') through an oxide layer which may have a thickness (referred to as T2') smaller than the T2 by $\Delta$T2. The comparator may compare the first leakage current with the second leakage currents and may determine whether the semiconductor device may be fabricated normally. The first MOS capacitor may have a gate area A1 which may meet the conditions of J1<J2 and J1'>J2', and the second MOS capacitor may have a gate area A2 which may meet conditions of J1<J2 and J1'>J2'.

In another exemplary embodiment of the present invention, a compensation system of leakage current may include a semiconductor device which may further include one or more MOS transistors, a semiconductor test device and a leakage current compensation device. The semiconductor test device may include first and second MOS transistors, which may be fabricated using the same, or similar, process as the MOS transistor and may compare first leakage current with second leakage current which may flow in the first and second MOS transistors, respectively, and may test whether the MOS transistors of the semiconductor device may be fabricated normally. The leakage current compensation device may compensate for the leakage current which may flow in the MOS transistors of the semiconductor device and may be in response to an output signal of the semiconductor test device.

In exemplary embodiments of the present invention, the leakage current compensation device may provide the leakage current for the MOS transistors in response to an abnormal signal of the semiconductor test device if the semiconductor device may be fabricated abnormally, and may generate the leakage current in the MOS transistors.

In another exemplary embodiment of the present invention, a comparator may be provided which may receive at least a first leakage current and a second leakage current, may comparing the at least first and a second leakage current, and may output at least one output signal. The output signal may be in accordance with a result of the comparison of the at least first and second leakage currents.

The comparator, according to exemplary embodiments of the present invention, may include at least two transistors for receiving and comparing the at least two leakage currents, and at least one output for outputting at least one output signal. The comparing of the at least two leakage currents may include, outputting at least one output signal if a first leakage current may be greater than a second leakage current, and outputting at least one other output signal if a first leakage current may be less than a second leakage current.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention. In the drawings.

DETAILED DESCRIPTION OF EXEMPLARY EMBODIMENTS OF THE PRESENT INVENTION

The present invention will be described more fully with reference to the accompanying drawings, in which exemplary embodiments of the invention are shown. It should be understood, however, that exemplary embodiments of the present invention described herein can be modified in form and detail without departing from the spirit and scope of the invention. Accordingly, the exemplary embodiments described herein are provided by way of example and not of limitation, and the scope of the present invention is not restricted to the particular embodiments described herein.

In particular, the relative thicknesses and positioning of layers or regions may be reduced or exaggerated for clarity. Further, a layer is considered as being formed "on" another layer or a substrate when formed either directly on the referenced layer or the substrate or formed on other layers or patterns overlaying the referenced layer.

Figure 1:
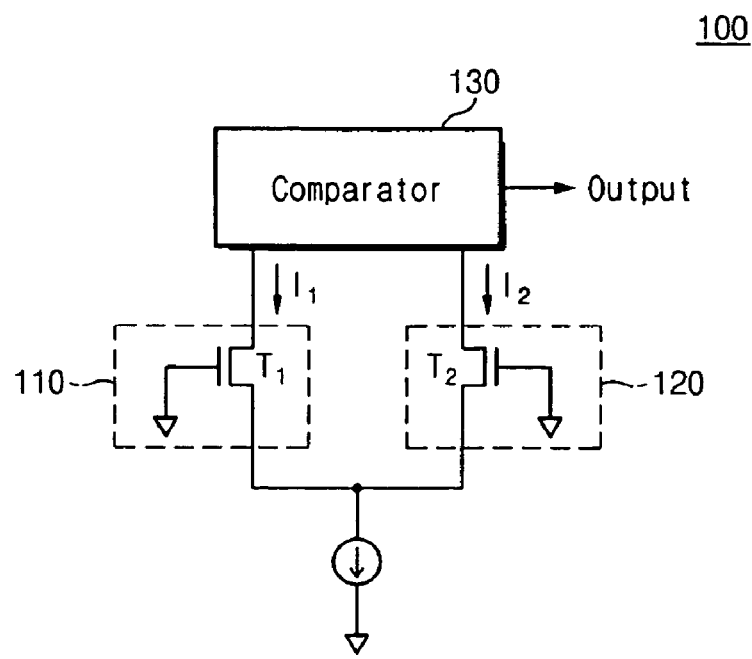
FIG. 1 is a block diagram illustrating an exemplary embodiment of a semiconductor test device which may use a channel leakage current.

FIG. 1 illustrates an exemplary embodiment of a semiconductor test device which may use leakage current according to the present invention. Referring to FIG. 1, a semiconductor test device 100 may include a first leakage current source 110, a second leakage current source 120 and a comparator 130.

The first and second leakage current sources 110 and 120 may comprise NMOS transistors T1 and T2, respectively. A ground voltage Vss may be applied to gates of the NMOS transistors T1 and T2, such that a channel may not be formed in an off-mode. The first and second leakage current sources 110 and 120 may provide first and second leakage currents I1 and I2 which may be for channels of the NMOS transistors T1 and T2, respectively, in the off mode. In FIG. 1, the first and second leakage current sources 110 and 120 may NMOS transistors but they can be replaced by PMOS transistors as well known to those skilled in the art.

The comparator 130 compares a first leakage current I1 may flow through the first leakage current source 110 and a second leakage current I2 may flow through the second leakage current source 120 to generate an output signal as a result. The output signal may indicate whether the semiconductor device (not shown) to be tested may be fabricated normally. The semiconductor device may be a circuit which may include a MOS transistor (e.g., an NMOS logic circuit in FIG. 11) and may be fabricated along with the semiconductor test device 100. The semiconductor test device 100 may be fabricated simultaneously and/or in the same circuit as the semiconductor device to be tested, that is, each semiconductor device may have a corresponding semiconductor test device. The semiconductor test device 100 may also be fabricated in different circuits than, and may be applied to, a plurality of semiconductor devices (not shown).

Figure 2:
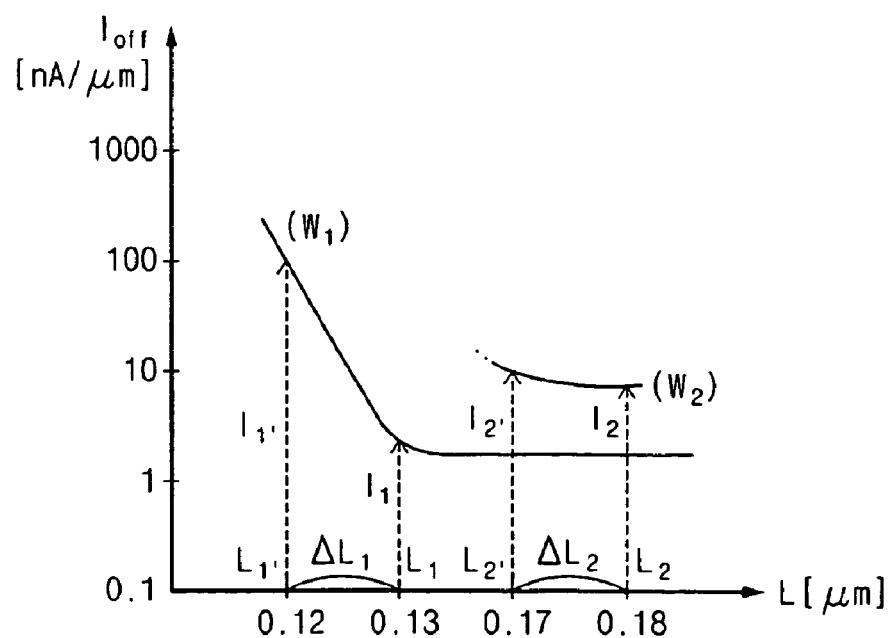
FIG. 2 is a schematic graph illustrating an example of a variation of the leakage current according to a variation of the channel length;.

FIG. 2 is a schematic graph illustrating an example of a variation of the leakage current according to a variation of channel length. A parallel axis of the graph may indicate a channel length L of the MOS transistor, and a vertical axis may indicate a leakage current $I_{off}$ which may flow through a channel of the MOS transistor in the off-mode.

Channel lengths of NMOS transistors T1 and T2 illustrated in FIG. 1 may be referred to as L1 and L2, respectively. The leakage currents which may flow through the channel may be referred to as I1 and I2, respectively. A critical channel length and a channel length of transistor may be defined as L1. A leakage current may vary in an interval where the channel length may be shorter than L1 (the critical channel length). The leakage current may not vary in an interval where the channel length may be larger than L1. The vertical axis of the graph may have a log scale. If the channel of the MOS transistor may be shorter than the critical channel length, the leakage current may increase drastically and may cause abnormal operation of the circuit. L2 may belong to the interval where the channel length may be larger than the critical channel length L1.

Channel lengths L1' and L2', which may be reduced in a semiconductor fabrication process, may be referred to as L1' and L2', respectively, and the leakage currents which may flow through the channel may be referred to as I1' and I2', respectively. The variation of the channel lengths may be ΔL1=L1−L1' and ΔL2=L2−L2', respectively. If ΔL1=ΔL2, the variation of the channel length in the semiconductor fabrication process may be larger than that of smaller channel length, that is, ΔL1/L1□ΔL2/L2.

The semiconductor test device 100 may use a channel leakage current according exemplary embodiments of the present invention and may determine a channel width W1 of the first leakage current source 110 and a channel width W2 of the second leakage current source 120.

The fabrication process may be performed normally, and the channel lengths of the first and second leakage current sources 110 and 120 become L1 and L2, respectively; the leakage current I2 of the leakage current source 120 may be larger than the leakage current I1 of the leakage current sources 110 (i.e. I2>I1). The fabrication process may be abnormally performed, and the channel lengths of the first and second leakage current sources 110 and 120 become L1' and L2', respectively; the leakage current I2' of the leakage current source 120 may be larger than the leakage current I1' of the leakage current source 120 (I2'>I1').

For example, L1=0.1 μm, L1'=0.12 μm, L2=0.18 μm, L2'=0.17 μm, I1=2 nA, I1'=100 nA and the channel width W1 of the first leakage current source 110 may be W1. A channel width W2 of the second leakage current source 120 may be defined to make I2 smaller than I1 and I2' smaller than I1'.

The first and second leakage current sources 110 and 120, which may include W1 and W2 satisfying the above relationship, may be used in the circuit in FIG. 1 and may be embodied with MOS transistors which may have a channel length greater than the target channel length.

Figure 3:
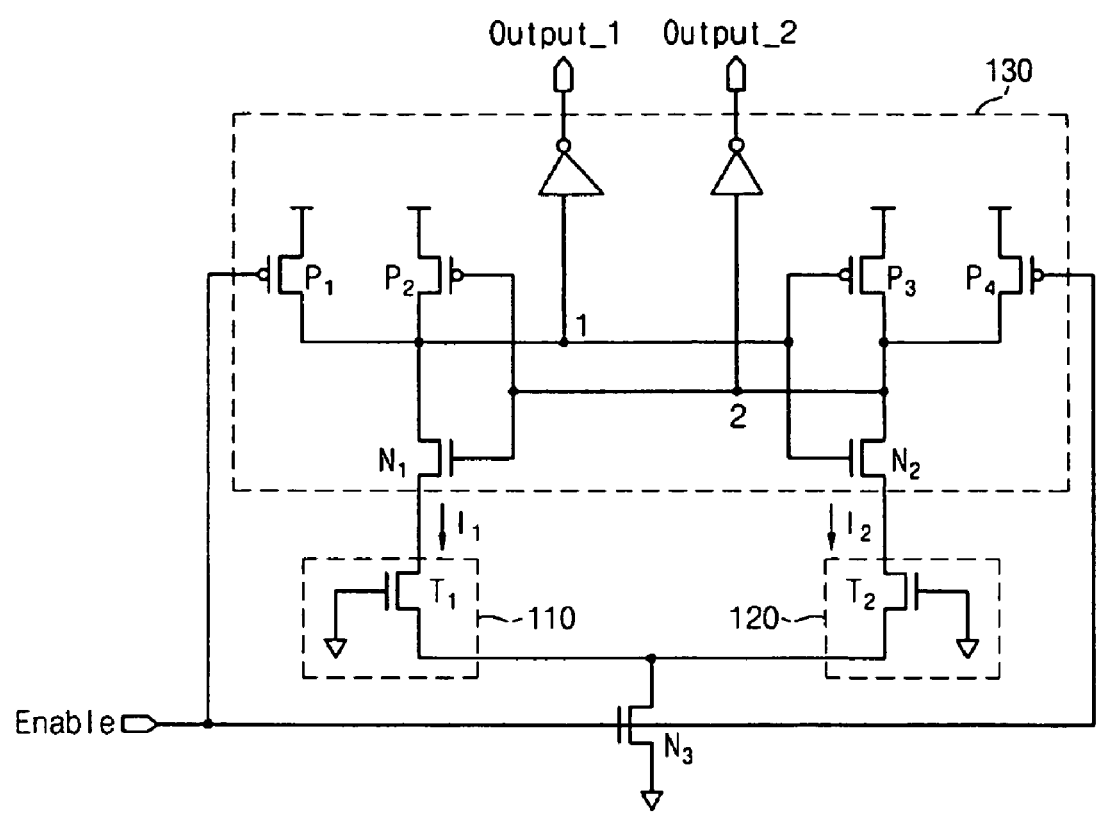
FIG. 3 is a circuit diagram illustrating an exemplary embodiment of the comparator in FIG. 1.

FIG. 3 is an example of a circuit diagram illustrating an exemplary embodiment of the comparator in FIG. 1. Referring to FIG. 3, the comparator 130 may include at least two NMOS transistors N1 and N2, at least four PMOS transistors P1~P4, and at least two inverters INV1 and INV2.

The Enable signal may be 'L', the PMOS transistors P1 and P4 may be turned-on, the NMOS transistors N3 may be turned-off, and Nodes 1 and 2 may become 'H'.

Nodes 1 and 2 may be 'H', the PMOS transistors P2 and P3 may be turned off, the NMOS transistors N1 and N2 may be turned-on, the Enable signal may be 'H', the PMOS transistors P1 and P4 may be turned-off and the NMOS transistor N3 may be turned-on.

The second leakage current I2 may be larger than the first leakage current I2, a node 2 may become 'L', a node 1 may become 'H', an output signal Output_1 may become 'L', and an output signal Output_2 may become 'H', when the first and second leakage current sources 110 and 120 may be fabricated normally (i.e., the channel lengths are L1 and L2, respectively).

The second leakage current I2' may be smaller than the first leakage current I1', the node 2 may become 'H', the node 1 may become 'L', the output signal Output_1 may become 'H', and the output signal Output_2 may become 'L', when the first and second leakage current sources 110 and 120 may have been fabricated abnormally (i.e., channel lengths are L1' and L2'). The output signal from the comparator 130 may notify whether the semiconductor device (not shown) may have been fabricated normally.

Figure 4:
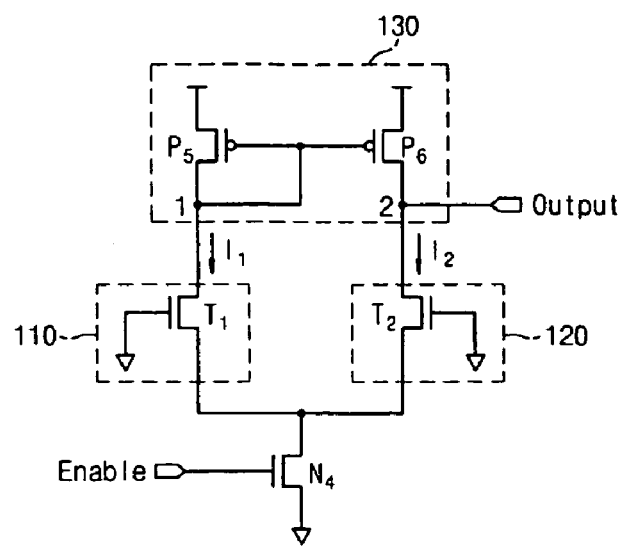
FIG. 4 is a circuit diagram illustrating an exemplary embodiment of the comparator in FIG. 1.

FIG. 4 is an example of a circuit diagram illustrating another exemplary embodiment of the comparator in FIG. 1. Referring to FIG. 4, the comparator 130 may comprise at least two PMOS transistors P5 and P6. The Enable signal may be in a state 'H', and the NMOS transistor N4 may be turned-on.

The first leakage current I2 may be larger than the first leakage current I1, the node 2 may become 'L', the node 1 may become 'H', and the output signal Output may become 'L', when the first and second leakage current sources 110 and 120 may have been fabricated normally (i.e., the channel lengths are L1 and L2 respectively).

The second leakage current I2' may be smaller than the first leakage current I1', the node 2 may become 'H', the node 1 may become 'L', and the output signal Output may become 'H', when the first and second leakage current sources 110 and 120 may have been fabricated abnormally (i.e., the channel lengths are L1' and L2', respectively). The semiconductor device (not shown) may be fabricated abnormally, and the output signal Output of 'H' may be generated from the comparator 130.

Figure 5:
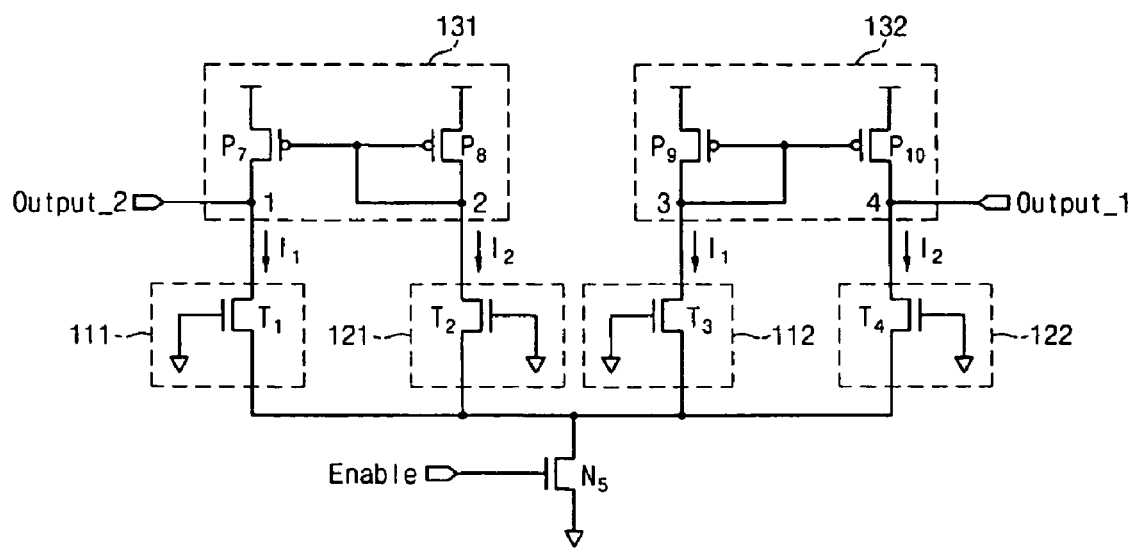
FIG. 5 is a circuit diagram illustrating another exemplary embodiment of a semiconductor test device which may use a channel leakage current.

FIG. 5 is an example of a circuit diagram illustrating another exemplary embodiment of the semiconductor test device which may use a channel leakage current. Referring to FIG. 5, the semiconductor test device, according to an exemplary embodiment of the present invention may comprise at least two semiconductor test devices in FIG. 4 which may be connected in parallel.

The Enable signal may be 'H', and the NMOS transistor N5 may be turned-on. The second leakage current I2 may be larger than the first leakage current I1, nodes 2 and 4 may become 'L', nodes 1 and 3 may become 'H', an output signal Output_1 may become 'L', and an output signal Output_2 may become 'H', when the first leakage current sources 111 and 112 and second leakage current sources 121 and 122 may have been fabricated normally (i.e., the channel lengths may be L1 and L2, respectively).

The second leakage current I2' may be smaller than the first leakage current I1', the nodes 2 and 4 may become 'H', the nodes 1 and 3 may become 'L', the output signal Output_1 may become 'H', and the output signal Output_2 may become 'L', when the first leakage current sources 111 and 112 and the second leakage current sources 121 and 122 may have been fabricated abnormally (i.e., if the channel lengths may be L1' and L2'). The semiconductor device (not shown) may be determined to have been normally or fabricated abnormally through an output signal.

Figure 6:
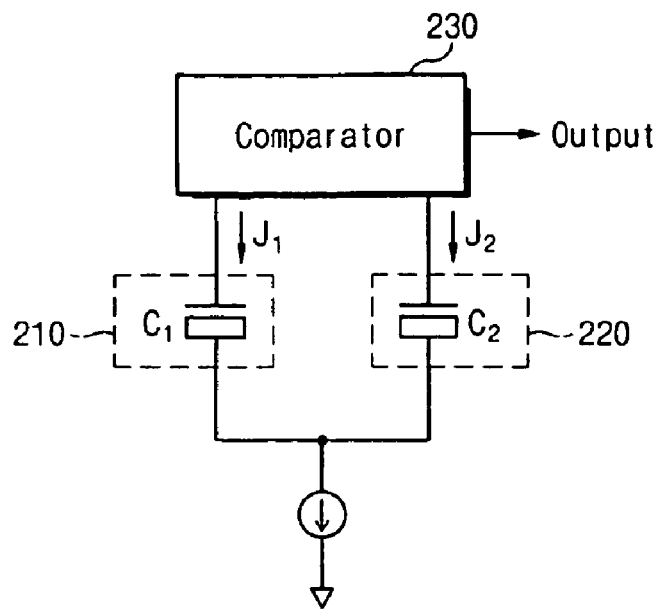
FIG. 6 is a block diagram illustrating another exemplary embodiment of a semiconductor test device which may use a gate leakage current.

FIG. 6 illustrates an exemplary embodiment of the semiconductor test device which may use a gate leakage current. Referring to FIG. 6, the semiconductor test device 200 may include a first leakage current 210, a second leakage current 220, and a comparator 230. The first and second leakage current sources 210 and 220 may comprise at least NMOS transistors C1 and C2. The NMOS transistors C1 and C2 may form a MOS capacitor when the drain and source may be connected to each other. The first and second leakage current sources 210 and 220 may flow first and second leakage currents J1 and J2 through gates of the NMOS transistors C1 and C2, respectively. In FIG. 6, the first and second current sources 210 and 220 may be an NMOS transistor.

The comparator 230 may compare a first leakage current J1, which may flow through the first leakage current source 210, with a second leakage current J2, which may flow through the second leakage current source J2, and may generate the output signal Output. The output signal may notify the semiconductor device (not shown), which may be tested, may have been fabricated normally.

Figure 7:
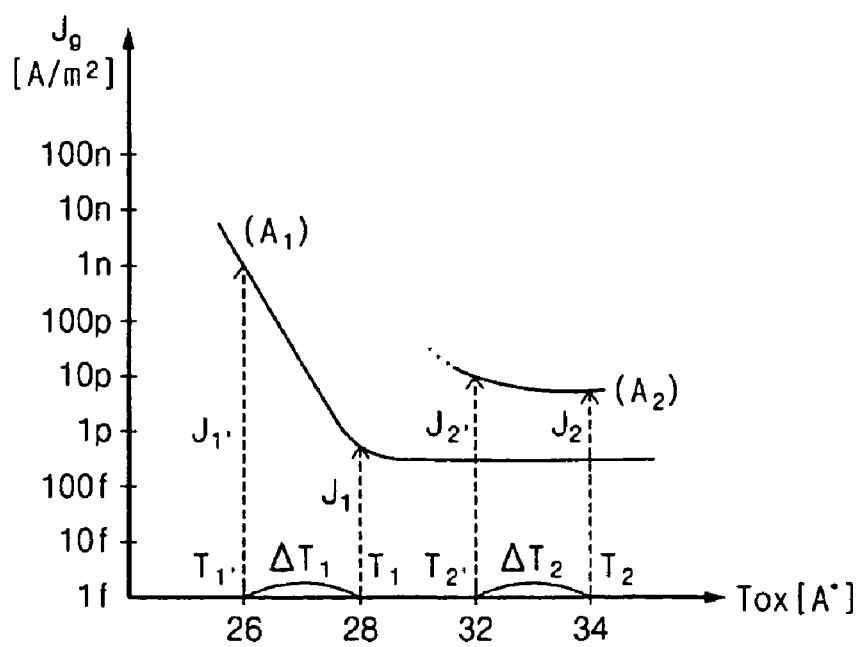
FIG. 7 is a schematic graph illustrating an example of a variation of leakage current according to a thickness variation of oxide layer.

FIG. 7 is a schematic graph illustrating an example of a variation of a leakage current according to an example of a thickness variation of the oxide layer. A parallel axis of the graph may indicate a thickness of oxide (Tox) of the MOS transistor. A vertical axis may indicate a leakage current Jg which may flow through a gate of the MOS transistor.

Thicknesses of the NMOS transistor C1 and C2 may be referred to as T1 and T2, respectively, and a leakage current which may flow through the gate may be referred to as J1 and J2, respectively. The leakage currents of the gate may be referred to as J1 and J2, respectively. T1 may be a critical thickness of oxide layer and may be a thickness of oxide layer of the transistor. The leakage current may vary in an interval where the thickness of oxide layer may be smaller than the critical thickness of oxide layer. The leakage current may not vary in an interval where the thickness of oxide layer may be larger than the critical one. T2 may be a thickness of oxide layer which may belong to the interval where the thickness of oxide layer may be larger than T1.

Thicknesses of oxide layers, which may be reduced during a semiconductor fabrication process, may be referred to as T1' and T2', and the leakage currents, which may flow through the gate, may be referred to as J1' and J2'. The variations of thickness of oxide layer may be ΔT1=T1−T1' and ΔT2=T2−T2'. If ΔT1=ΔT2, thickness variation rate of oxide layer may be larger at the oxide layer which may have a smaller thickness, that is, ΔT1/T1□ΔT2/T2.

The semiconductor test device 200, which may use gate leakage current, may determine a gate area A1 of the first leakage current source 210 and a gate area A2 of the second leakage current source 220. The leakage currents may have a relationship of J2>J1, if the semiconductor fabrication process may be performed normally, and may form the oxide layers of the first and second leakage current sources 210 and 220 (for example, the transistors and/or capacitors as described herein) which may have thicknesses of T1 and T2, respectively. The leakage currents may have a relationship of J2'<J1', for example, T1=28 □, T1'=0.12□, T2=34□ and T2'=32□, if the semiconductor fabrication process may be performed abnormally, and may form the oxide layers of the first and second leakage current sources 210 and 220 which may have thicknesses T1' and T2', respectively. For example, J1=1p□, J1'=1n□, and the gate area of the first leakage current source 210 may be A1, the gate area A2 of the second leakage current source 220 may be determined to meet the condition of J2>J1, and J2'<J1'.

The circuit in FIG. 6 may use the first leakage current source 210, which may have the gate area A1, the second leakage current source 220, which may have the gate area A2, in accordance with the above relationship, and the MOS transistors may have an oxide layer of which the thickness may be greater than the critical thickness.

Figure 8:
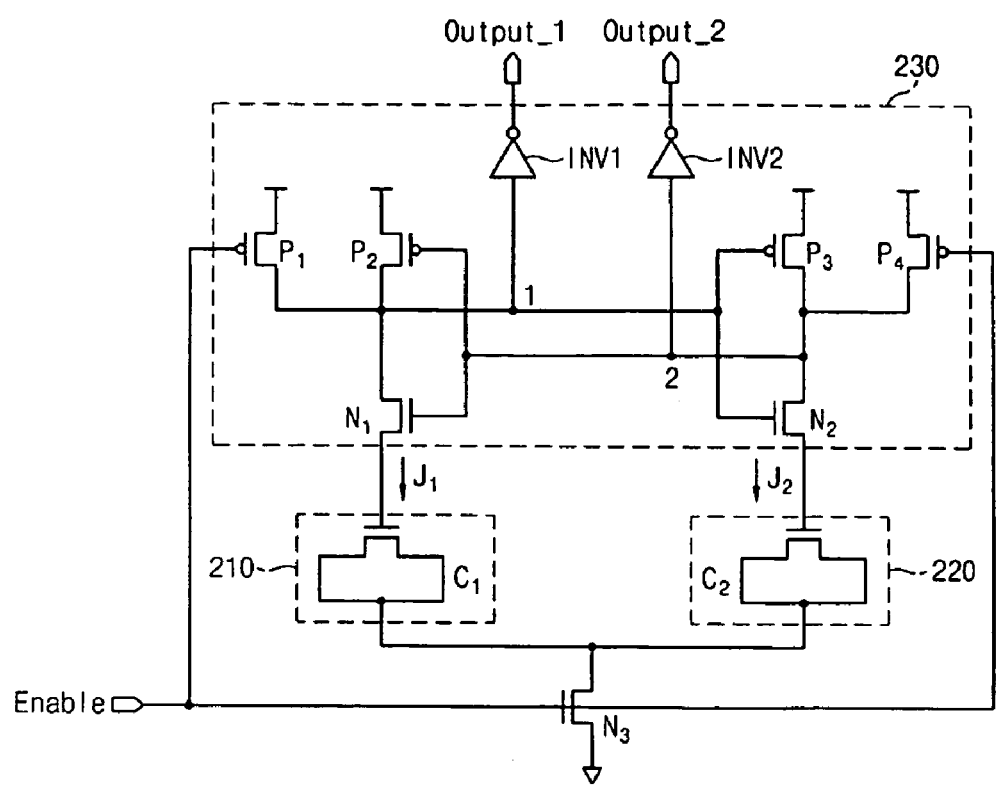
FIG. 8 is a circuit diagram illustrating an exemplary embodiment of the comparator in FIG. 6.

FIG. 8 is a circuit diagram of a exemplary embodiment of the comparator in FIG. 6. Referring to FIG. 8, the comparator 230 may comprise at least two NMOS transistors N1 and N2, at least four PMOS transistors P1 to P4, and at least two inverters INV1 and INV2. The operation principle of the comparator 230 may be similar or identical to the comparator 130. The output signal of the comparator 230 may be a ground and may determine whether the semiconductor device (not shown) may be fabricated normally.

Figure 9:
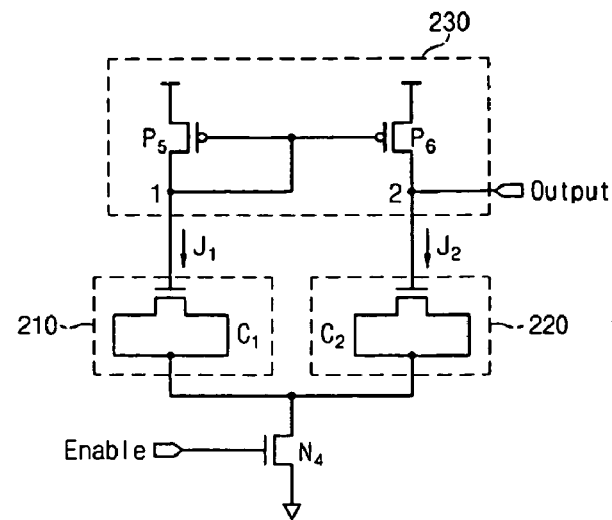
FIG. 9 is a circuit diagram illustrating an exemplary embodiment of the comparator in FIG. 6.

FIG. 9 is an example of a circuit diagram illustrating another exemplary embodiment of the comparator in FIG. 6. Referring to FIG. 9, the comparator 230 may comprise at least two PMOS transistors P5 and P6. The comparator 230 may operate on the same or similar principle as in FIG. 4.

Figure 10:
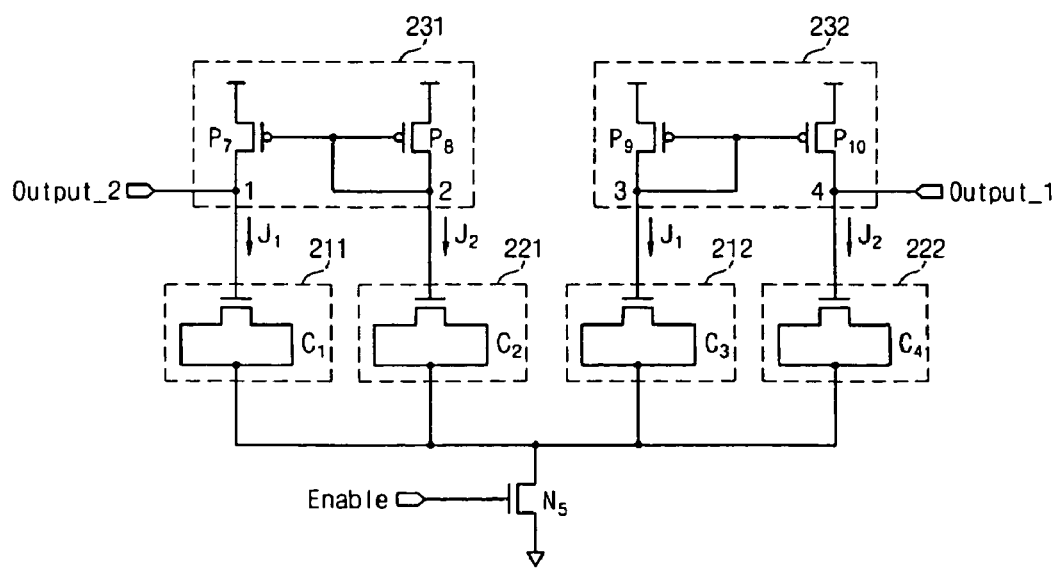
FIG. 10 is a circuit diagram illustrating another exemplary embodiment of a semiconductor test device which may use a gate leakage current.

FIG. 10 is a circuit diagram illustrating another exemplary embodiment of the semiconductor test device may use a gate leakage. The semiconductor test device may operate on the same principle as that in FIG. 5.

Figure 11:
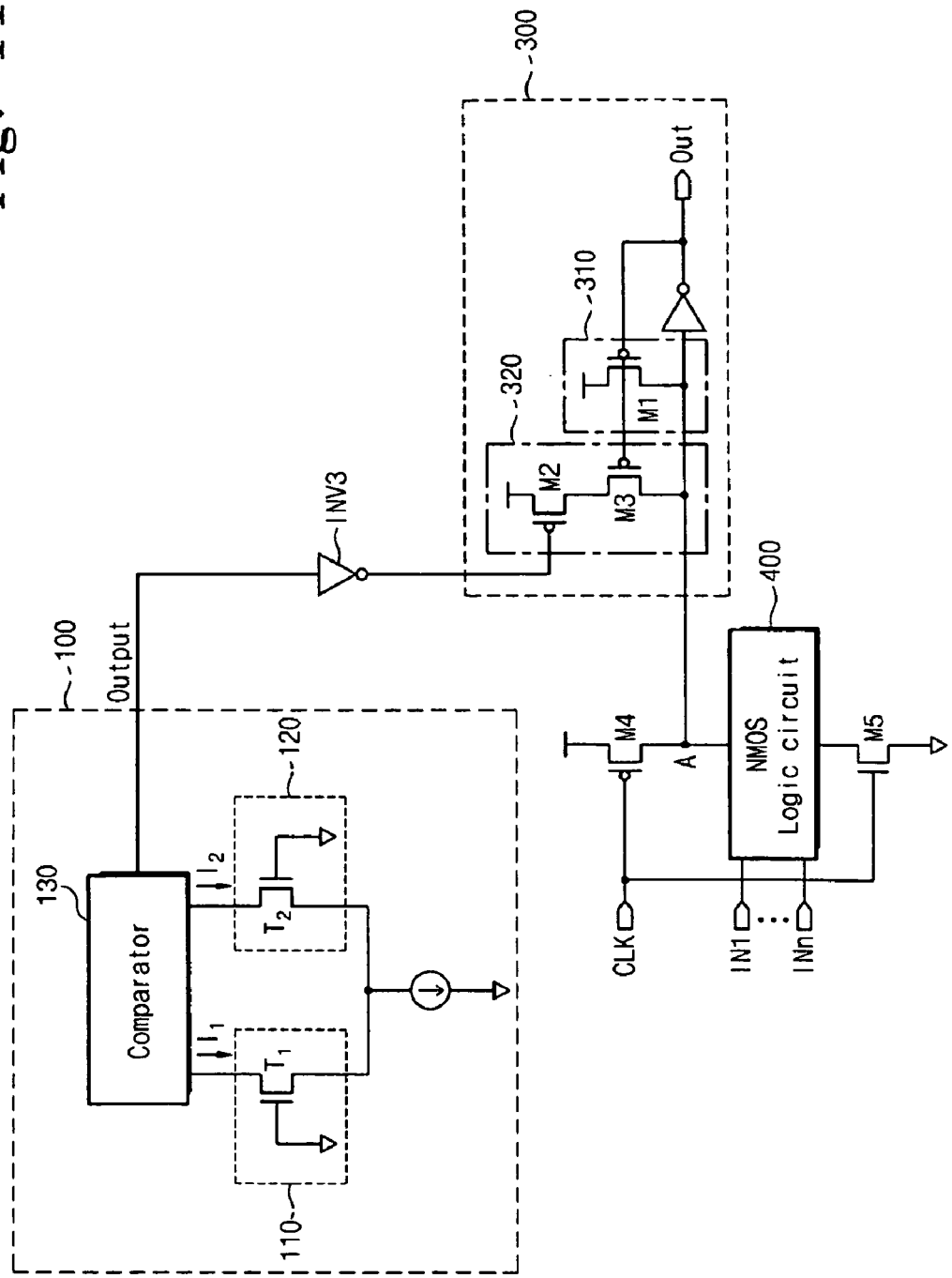
FIG. 11 is a circuit diagram illustrating an exemplary embodiment of a compensation system of leakage current.

FIG. 11 is a circuit diagram illustrating a compensation system of leakage current which may use a semiconductor test device, such as semiconductor test device 100. Referring to FIG. 11, the output signal of the semiconductor test device 100 may be input to a leakage current compensation device 300 via an inverter INV3. The leakage current compensation device 300 may comprise first and second compensation circuits 310 and 320, and may compensate the leakage current which may flow in the NMOS logic circuit 400.

The NMOS logic circuit 400 may include one or more NMOS transistors. The channel length of the NMOS transistor may have been fabricated abnormally, and the NMOS logic circuit 400 may perform abnormal operations because a leakage current may flow rapidly in an off-mode. A semiconductor test device 100 may detect a leakage current which may flow in the NMOS logic circuit 400 and a leakage current compensation device 300 may compensate for the leakage current of the NMOS logic circuit.

When the clock signal CLK may be in a first logic state (for example, "low" or 'L'), a PMOS transistor M4 may be turned on, an NMOS transistor M5 may be turned off, and node A may be in a second logic state (for example, "high" or 'H'). When the clock signal CLK may be 'H', the PMOS transistor M4 may be turned off and the NMOS transistor M5 may be turned on. When the NMOS logic circuit 400 may be in the off-mode by the input signals IN1, IN2, . . . , and INn, the node A may be 'H'. If the semiconductor fabrication process may be abnormally performed, which may form the channel lengths of the NMOS transistors in the NMOS logic circuit 400 smaller than the critical channel length, the leakage current may increase in the off-mode, and it may be possible that the state of the node A may be changed to 'L'.

The semiconductor test device 100 may sense the leakage current, which may flow in the off-mode due to abnormally-fabricated NMOS logic circuit 400, and may generate an output signal 'Output'.

The leakage current compensation device 300 may reduce the probability of the node from being changed to 'L' unexpectedly. The first compensation circuit 310 may comprise at least one PMOS transistor M1 and may compensate for the leakage current, which may flow in the NMOS logic circuit 400, when the semiconductor fabrication process may be performed normally. If the leakage current may increase due to the abnormal process, a second compensation circuit 320 may be included in addition to the first compensation circuit 310.

When the channel length may be fabricated normally, a normal signal 'L' may be generated as the output signal 'Output' of the semiconductor test device 100. When the channel length may be fabricated abnormally, the abnormal signal 'H' may be generated. The signals may pass through the inverter INV3 and may be inverted and the inverted signal may be input to the second compensation circuit 320. If the channel length may be normal, the signal 'H' may be input to the second compensation circuit 320, and if abnormal, the signal 'L' may be input.

When the semiconductor fabrication process may be performed normally, which may form the channel length normally; the signal 'H' may be input to the second compensation circuit 320, may make the PMOS transistor M2 turn off, and the second compensation circuit 320 may not operate. When the semiconductor fabrication process may be carried out abnormally, which may make the channel length abnormal, the leakage current may increase rapidly, and the semiconductor test device 100 may generate an abnormal signal 'L' which may be input to the second compensation circuit 320. The PMOS transistor M2 may be turned on and may provide an additional current for node A according to the output 'Output', such that an unstable state of node A or a logic fail, which may be caused by the leakage current of the NMOS logic circuit 400.

Figure 12:
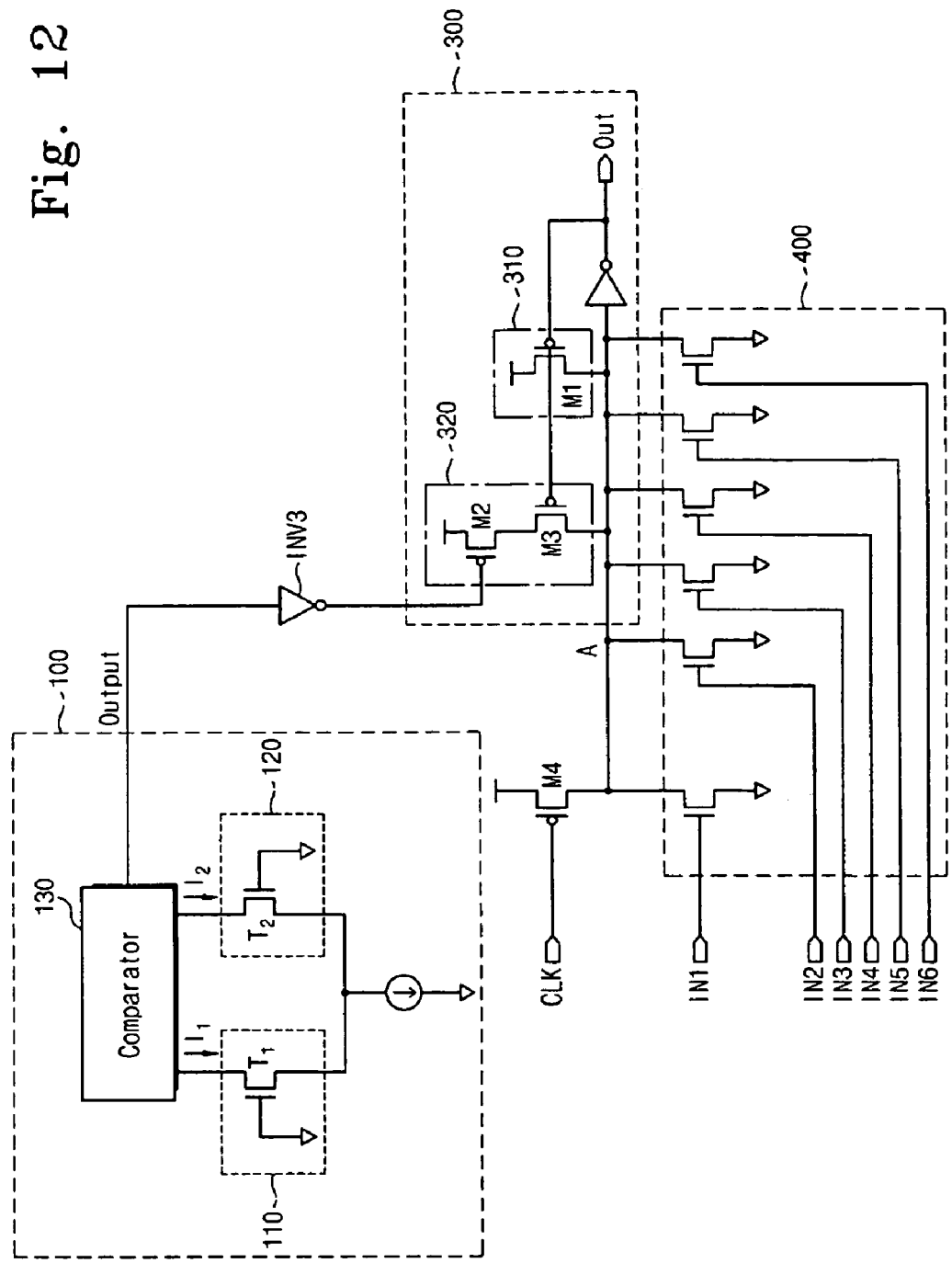
FIG. 12 is a circuit diagram illustrating an exemplary embodiment of an NMOS logic circuit in FIG. 11.

FIG. 12 illustrates an exemplary embodiment of the compensation system of leakage current in FIG. 11. Referring to FIG. 12, the structure of the first and second compensation circuits 310 and 320 and an operation principle may be similar to those in FIG. 11. In FIG. 12, the clock signal CLK may be 'H' and input terminals IN1 to IN6 of the NMOS logic circuit 400 may be grounded, such that the NMOS transistors may be in the off-mode. If the NMOS transistors may have been fabricated normally, the first compensation circuit 310 may reduce the probability of an unstable state of the node A and/or the probability of a logic fail may be reduced because of the small leakage current. If the NMOS transistors may have been fabricated abnormally, which may increase the leakage current rapidly, the second compensation circuit 320 may begin to compensate for the loss, which may be due to the leakage current, and may reduce the probability of an unstable state of the node A.

In FIGS. 11 and 12, the semiconductor test device 100, which may use the channel leakage current, may be explained as an exemplary embodiment of the compensation system of leakage current, but it may be well known to those skilled in the art that the semiconductor test device 100 may use a gate leakage current which may operate on a similar principle, the same principle, or any other principle as desired by one of ordinary skill in the art.

According to exemplary embodiments of the present invention, a semiconductor test device, which may use the channel leakage current may test a MOS transistor, which may be fabricated to have a channel length smaller than the critical one during a semiconductor fabrication process. The semiconductor test device, which may use a gate leakage current according to exemplary embodiments of the present invention, may test a MOS transistor, which may be fabricated to have an oxide layer thinner than a critical thickness during the semiconductor fabrication process. According to exemplary embodiments of the compensation system of leakage current, malfunctioning of circuit, which may be due to the leakage current, may be reduced.

Although exemplary embodiments of the present invention have been described as including NMOS transistors, it will be known that any transistor, for example, a PMOS transistor, may be used in exemplary embodiments of the present invention as desired by one of ordinary skill in the art.

Although exemplary embodiments of the present invention have been described as comparing MOS transistor leakage current in determining whether a semiconductor devices may be fabricated normally, it will be understood that any current, for example, a channel or gate current, may be used as desired by one of ordinary skill in the art.

Although exemplary embodiments of the present invention have been described as using a first logic state 'L' and a second logic state 'H', it will be understood by one of ordinary skill in the art that these first and second logic states are interchangeable, for example a first logic state may be 'H' and a second logic state may be 'L', without departing from the scope and spirit of the invention.

Although exemplary embodiments of the present invention have been described in connection with the accompanying drawings, it is not limited thereto. It will be apparent to those skilled in the art that various substitution, modifications and changes may be thereto without departing from the scope and spirit of the invention.

What is claimed is:

1. A compensation system comprising:
    a semiconductor test device including first and second MOS transistors and a comparator, the first and second MOS transistors being fabricated in the same process as MOS transistors of a semiconductor device, and the comparator being configured to compare first and second leakage currents flowing in the first and second MOS transistors to test whether the MOS transistors of the semiconductor device are fabricated normally; and
    a leakage current compensation device configured to compensate for leakage current flowing in the MOS transistors of the semiconductor device in response to an output signal from the semiconductor test device.

2. The system of claim 1, wherein
    the first MOS transistor flows a first leakage current through a channel having a critical channel length or a first leakage current through an oxide layer having a channel length smaller than the critical channel length, in an off-mode,
    the second MOS transistor flows a second leakage current through a channel having a critical channel length larger than the critical channel length or a second leakage current through a channel having a thickness smaller than a second channel length, in an off-mode, and
    the comparator compares the first leakage current with second leakage current to determine whether the semiconductor device is fabricated normally,
    wherein the first MOS transistor has a first channel width such that the first leakage current is less than the second leakage current when the MOS transistors are fabricated normally, and the first leakage current is less than the second leakage current if the MOS transistors are fabricated abnormally, and
    wherein the second MOS transistor has a second channel width such that the second leakage current is greater than the first leakage current when the MOS transistors are fabricated normally, and the second leakage current is less then the first leakage current when the MOS transistors are fabricated abnormally.

3. The system of claim 1, wherein the compensation system of leakage current provides a leakage current for the MOS transistors in response to an abnormal signal of the semiconductor test device in case that the semiconductor device is fabricated abnormally to cause leakage current in the MOS transistors.

4. A compensation system comprising:
a semiconductor test device including first and second leakage current sources and a comparator, the first and second leakage current sources being fabricated in the same process as at least one potential leakage current sources of a semiconductor device, and the comparator being configured to compare first and second leakage currents flowing in the first and second leakage current sources to test whether the at least one potential leakage current source is fabricated normally; and
a leakage current compensation device configured to compensate for leakage current flowing in the at least one potential leakage current source in response to an output signal from the semiconductor test device.

5. The system of claim 4, wherein
the first leakage current source includes a first MOS capacitor flowing a first leakage current through an oxide layer having a thickness less than or equal to a critical thickness,
the second leakage current source includes a second MOS capacitor flowing a second leakage current through an oxide layer having a thickness greater than the critical thickness, but less than a second thickness, and
the comparator compares the first leakage current with the second leakage current to determine whether the semiconductor device is fabricated normally, wherein
the first MOS capacitor and the second MOS capacitor have gate areas A1 and A2, respectively, such that the first leakage current is less than the second leakage current when the MOS transistors are fabricated normally, and the first leakage current is greater than the second leakage current when the MOS transistors are fabricated abnormally.

6. The compensation system of claim 4, wherein if the comparator determines that the first leakage current is smaller than the second leakage current, the at least one potential leakage current source is fabricated normally, and if the first leakage current is larger than the second leakage current, the at least one potential leakage current source is fabricated abnormally.

7. The compensation system of claim 4, wherein the first and second leakage current sources each include at least one transistor.

8. The compensation system of claim 7, wherein the first and second transistors are NMOS transistors.

9. The compensation system of claim 7, wherein the first and second transistors are PMOS transistors.

10. The compensation system of claim 4, wherein the first leakage current source is a first transistor designed for flowing a first leakage current through a channel having a critical channel length or a first leakage current through a channel having a channel length shorter than the critical channel length, in an off-mode,
the second leakage current source is a second transistor designed for flowing a second leakage current through a channel having a channel length longer than the critical channel length or a second leakage current through a channel having a channel length shorter than a second channel length, in an off-mode,
the first transistor has a channel width W1 such that the first leakage current is less than the second leakage current when the at least one potential leakage current source is fabricated normally, and the first leakage current is less than the second leakage current if the at least one potential leakage current source is fabricated abnormally, and
the second transistor has a channel width W2 such that the second leakage current is greater than the first leakage current when the at least one potential leakage current source is fabricated normally, and the second leakage current is less then the first leakage current when the at least one potential leakage current source is fabricated abnormally.

11. The compensation system of claim 10, wherein the comparator generates a normal signal when the second leakage current is greater than the first leakage current, and an abnormal signal when the first leakage current is greater than the second leakage current.

12. The compensation system of claim 4, wherein
the first leakage current source is a first capacitor flowing a first leakage current through an oxide layer having a thickness less than or equal to a critical thickness,
the second leakage current source is a second capacitor flowing a second leakage current through an oxide layer having a thickness greater than the critical thickness, but less than a second thickness, and wherein
the first capacitor and the second capacitor have gate areas A1 and A2, respectively, such that the first leakage current is less than the second leakage current when the at least one potential leakage current source is fabricated normally, and the first leakage current is greater than the second leakage current when the at least one potential leakage current source is fabricated abnormally.

13. The compensation system of claim 12, wherein the comparator generates a normal signal when the second leakage current is greater than the first leakage current, and an abnormal signal when the second leakage current is less than the first leakage current.

* * * * *